United States Patent [19]
Sakayori

[11] Patent Number: 5,754,130
[45] Date of Patent: May 19, 1998

[54] ANALOGUE-TO-DIGITAL CONVERTER USING PHASE MODULATION

[75] Inventor: Hiroshi Sakayori, Sagamihara, Japan

[73] Assignee: Teratec Corporation, Musashino

[21] Appl. No.: 535,320

[22] Filed: Sep. 27, 1995

[30] Foreign Application Priority Data

Feb. 21, 1994 [JP] Japan ................................. 6-022632
Nov. 4, 1994 [JP] Japan ................................. 6-290087

[51] Int. Cl.$^6$ ........................................................ H03M 1/00
[52] U.S. Cl. ............................................. 341/111; 341/156
[58] Field of Search ................................... 341/111, 155, 341/156, 157, 159

[56] References Cited

U.S. PATENT DOCUMENTS

| | | | |
|---|---|---|---|
| 3,745,559 | 7/1973 | Mattern | 341/111 |
| 4,593,266 | 6/1986 | Palmer | 341/111 |
| 4,939,517 | 7/1990 | Baltus et al. | 341/156 |

FOREIGN PATENT DOCUMENTS

| | | |
|---|---|---|
| 40-051861 | 5/1974 | Japan. |
| 50-029342 | 9/1975 | Japan. |
| 5-03738 | 2/1993 | Japan. |

*Primary Examiner*—Jeffrey A. Gaffin
*Assistant Examiner*—Thuy-Trang N. Huynh

*Attorney, Agent, or Firm*—Cushman, Darbey & Cushman IP Group of Pillsbury Madison & Sutro LLP

[57] ABSTRACT

An ultrahigh-speed analog-to-digital converter that does not use optical signals is implemented by means of simple circuit configurations. To achieve this, phase differences between a carrier and modulated signals are detected, the modulated signals having been obtained by modulating the phase of the carrier with an analog signal. Analog-to-digital conversion is then performed by applying binary weighting to the modulation factors of the phase modulations. Alternatively, different relative delays are applied stepwise in $2^n-1$ stages (where n is the resolution) between the carrier and the signal that has been phase modulated by the analog signal. The phase of the signals with these delays and the phase of the signal without any delay are respectively compared in $2^n-1$ stages. An n-bit digital signal is formed and output on the basis of the results of these comparisons. The carrier may also be respectively shifted in a plurality of stages n by means of delay elements, and the phases of the outputs of the n phase modulations may be respectively compared with the phase of the carrier. An n-bit digital signal is formed and output on the basis of the results of these comparisons. In this case, the amount of hardware can be decreased by combining this method with the previously described method. High-speed analog-to-digital conversion can be performed in these ways, and improvements in precision, accuracy and operating frequency can be achieved. Noise rejection is excellent, and improved signal quality and conversion efficiency can be obtained.

9 Claims, 14 Drawing Sheets

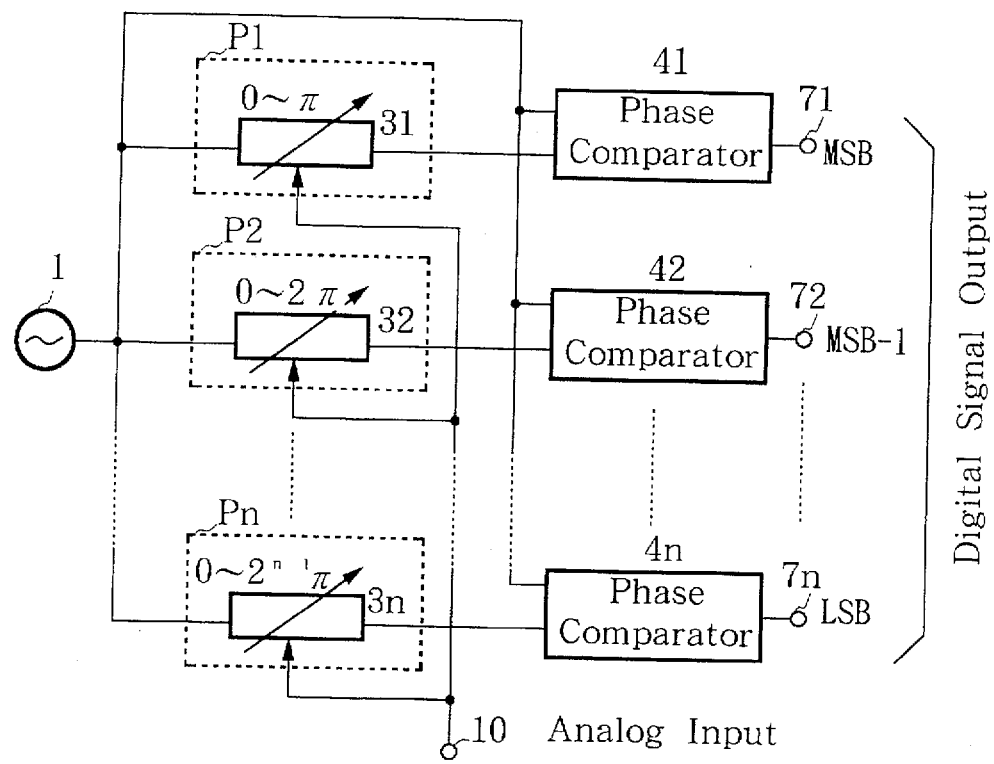
Fig. 1
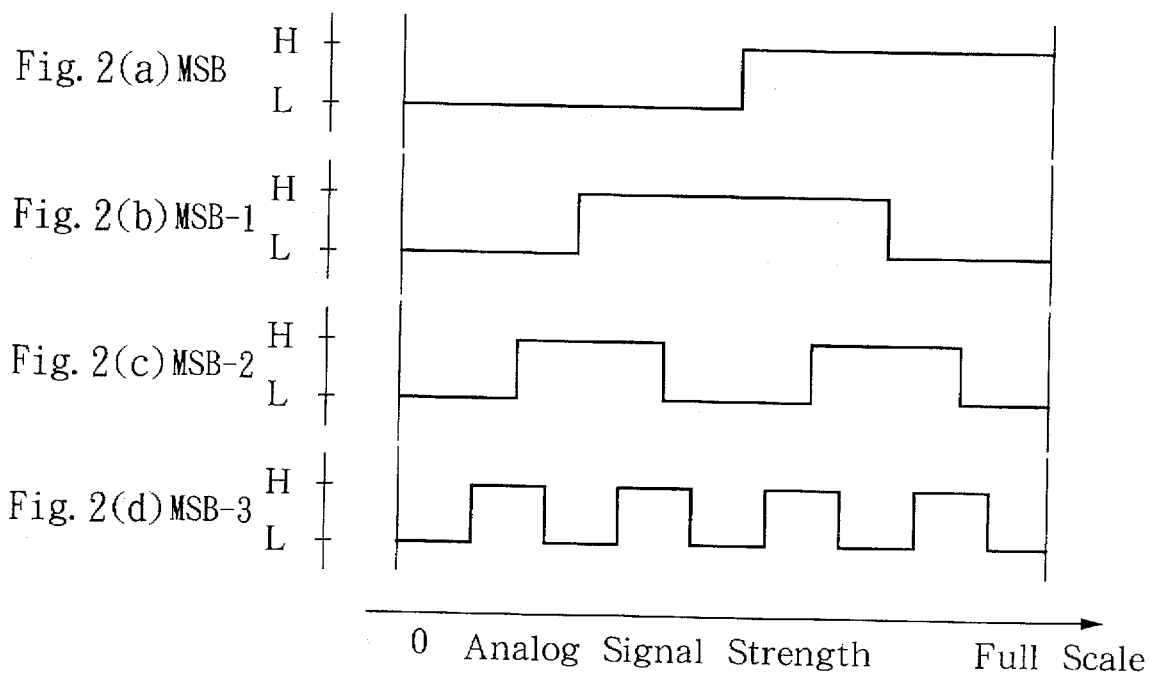
Fig. 2(a) MSB
Fig. 2(b) MSB-1
Fig. 2(c) MSB-2
Fig. 2(d) MSB-3

Resistive Divider
($R_0$ is Characteristic Impendance)

Transmission Line with Impedance $(\sqrt{2})R_0$ and Electrical Length $\lambda/4$ Wilkinson Divider

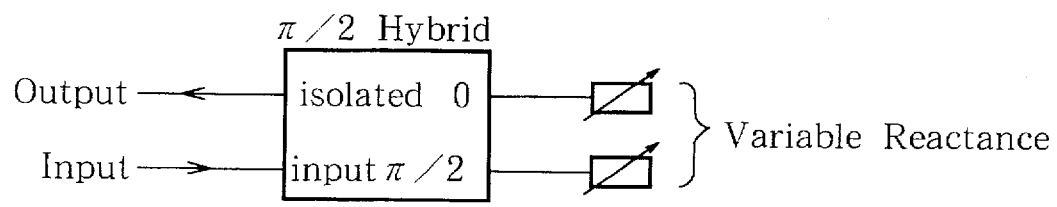
Fig. 9
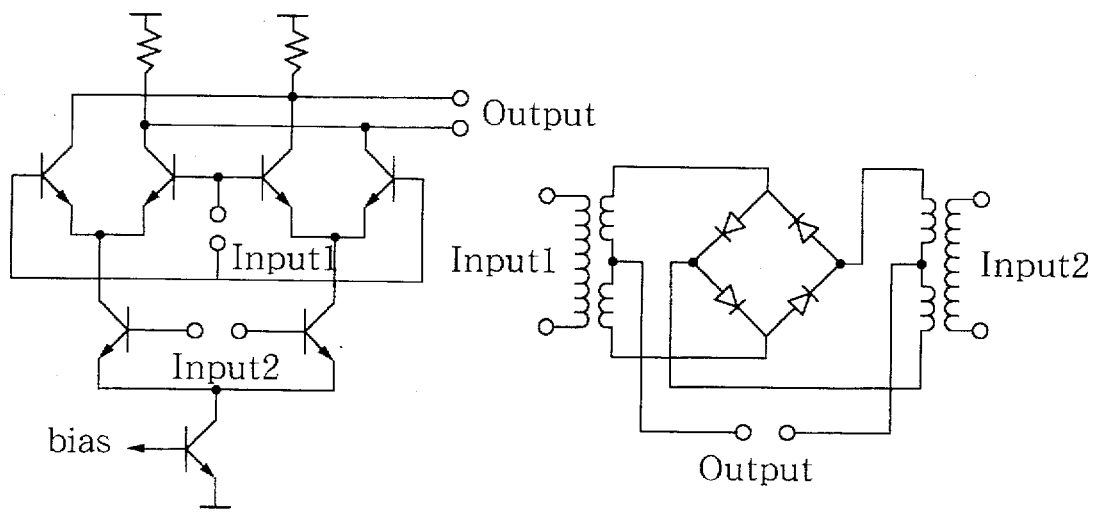
Multiplier
Fig. 10 (a)
Diode Mixer
Fig. 10 (b)

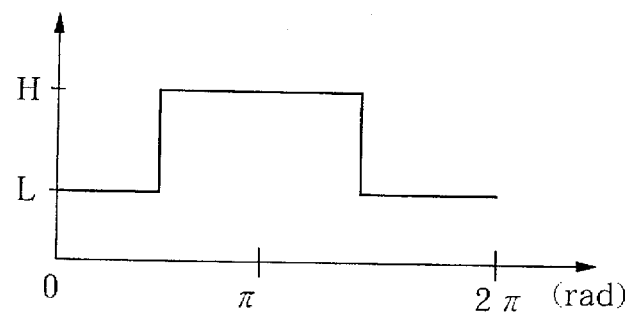
Fig. 12
Fig. 13 (a) A
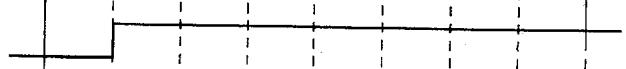
Fig. 13 (b) B
Fig. 13 (c) C
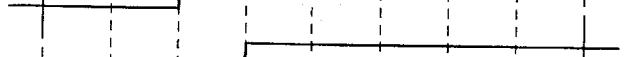
Fig. 13 (d) D
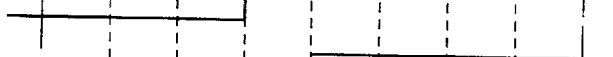
Fig. 13 (e) E
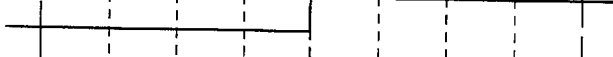
Fig. 13 (f) F
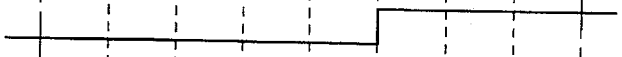
Fig. 13 (g) G
Fig. 13 (h) D1 (MSB) — D
Fig. 13 (i) D2 — B ⊕ F
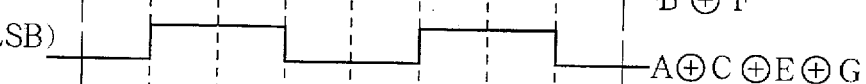
Fig. 13 (j) D3 (LSB) — A ⊕ C ⊕ E ⊕ G
Analog Input Level    F.S.

1

ANALOGUE-TO-DIGITAL CONVERTER USING PHASE MODULATION

TECHNICAL FIELD

This is a Continuation of International Appln. No. PCT/JP95/00133 filed Feb. 2, 1995 which designated U.S.

This invention is utilized as an element of an electronic circuit, and for high-speed analog-to-digital conversion. It is suitable for use in sampling oscilloscopes and LSI testers, and relates in particular to technology for improving the conversion precision and sensitivity of ultrahigh-speed analog-to-digital converters.

BACKGROUND TECHNOLOGY

A prior art example will be explained with reference to FIG. 19, which shows a conventional ultrahigh-speed analog-to-digital converter. FIG. 19(a) shows a known circuit for performing ultrahigh-speed analog-to-digital conversion: namely, an analogue-to-digital converter which changes the phase of light in accordance with the electric field strength of an analog input, and which employs a Mach-Zehnder interferometer to convert this to optical intensity by means of interference. Analog-to-digital conversion is achieved by applying binary weighting to the phase changes (see "Novel GaAs/AlGaAs Guided-Wave Analog/Digital Convertor", R. G. Walker et al., *Electronics Letters*, 12th Oct. 1989, Vol.25, No.21, pp.1443–1444). FIG.19(b) shows an implementation of this analogue-to-digital converter.

With an analog-to-digital converter employing a Mach-Zehnder interferometer, noise from the optical source, and phase noise in particular, is large compared with the signal obtained by the electrical means, and the conversion efficiency of Mach-Zehnder interferometers and other electro-optic converters is low, so that a large-amplitude analog input signal is required in order to obtain adequate signal strength. In order to improve conversion efficiency, it is necessary to lengthen the interferometer, which means that a large analog-to-digital converter becomes necessary. However, a large signal input will still be required to drive such a large interferometer.

In the prior art example described above, light which has been phase modulated in accordance with an analog input is used to produce interference, whereby an optical intensity corresponding to a phase difference is obtained. However, with this method, if the phase and amplitude characteristics of each optical phase modulator are not strictly controlled, it will be impossible to obtain an interference output with the desired precision and intensity.

The present invention has been designed in the light of this situation. It is an object of this invention to improve the precision and accuracy of analog-to-digital converters and to enable them to operate at higher frequencies. It is a further object of this invention to provide an ultrahigh-speed analog-to-digital converter which has high sensitivity. Finally, it is another object of this invention to provide an analog-to-digital converter which can achieve high resolution analog-to-digital conversion by means of a simple circuit configuration.

DISCLOSURE OF THE INVENTION

This invention is characterized in that, despite offering ultrahigh-speed conversion, high signal quality is ensured and efficient conversion performed by means of electric signals alone, without using optical signals. Namely, this invention is an analog-to-digital converter which is characterized in that it has an analog signal input terminal, a carrier generator, and a plural number n of phase modulators which respectively phase modulate this carrier with the analogue signal; and the modulation factor of the $i^{th}$ modulator of these n phase modulators ($i \leq n$) is:

$$\theta \times 2^{i-1}$$

where $\theta$ is a constant; and it has n phase comparators which respectively compare the phase of the output of these n phase modulators with the phase of the aforementioned carrier, and n digital output terminals from which the output of these phase comparators is respectively sent.

It is desirable for the carrier to be a sine wave. It is also desirable if $\theta = \pi$ radians.

The aforementioned $i^{th}$ phase modulator can also be constituted from phase modulating elements with modulation factor $\theta$ cascade-connected in $2^{i-1}$ stages.

An alternative configuration is for at least some of the plurality of cascade-connected phase modulating elements to be shared by the plurality of phase modulators.

The phase of the carrier is modulated in proportion to the analog signal, and analog-to-digital conversion is performed by using the periodicity of the phase modulation (i.e., the phase of the output cycles between 0 and $2\pi$ radians as the strength of the modulating signal increases). That is to say, the modulated signal and the carrier are both input to a phase comparator. By way of example, the output of the phase comparator is made logical level "L" when the phase difference between the modulated wave and the carrier is within the range $0 \pm (\frac{1}{2})\pi$ radians, and is made logical level "H" when said phase difference is within the range $\pi \pm (\frac{1}{2})\pi$ radians. Under these circumstances, if the modulation factor for the most significant bit is made $\pi$ radians, the output of the phase comparator will be "L" for analog inputs from "0" to ½ full scale, and "H" for analog inputs from ½ full scale to full scale. Because the modulation factor for the bit in the next position is doubled, the phase comparator output will be "L" for analog inputs from "0" to ¼ full scale, "H" for analog inputs from ¼ full scale to ¾ full scale, and "L" again from ¾ full scale to full scale. Conversion to successive digital signals is carried out in this way down to the least significant bit, thereby converting the analog signal to a digital signal in positive logic Gray code.

The number of phase modulators provided for forming modulated signals has to be the same as the number of bits, and their modulation factor has to double with every move from the most significant bit towards the least significant bit. A modulation factor of $n\theta$ can be obtained by, for example, connecting a plurality of phase modulating elements with modulation factor $\theta$ in series, whereupon this $\theta$ is multiplied by the number of connected stages n. The desired modulation factor can be obtained by establishing a suitable number of connected stages.

An ultrahigh-speed analog-to-digital converter with high precision, accuracy and sensitivity can be achieved in this manner.

According to an alternative configuration, this invention has an analog signal input terminal, a carrier generator, and a first phase modulating element which phase modulates this carrier with the analog signal; and $2^n - 1$ delay elements are provided in the output path of the aforementioned carrier or in the output path of the aforementioned first phase modulating element, said delay elements applying, in $2^n - 1$ stages (where n is the resolution), different relative delays between the aforementioned carrier and the output signal from the aforementioned first phase modulating element; and the relative delay time of the $i^{th}$ delay element of these $2^n-1$ delay elements ($i \leq n$) is set to:

$$(i-1) \cdot T/(2^{n+1})$$

where T is the carrier period; and there are also provided $2^n-1$ first phase comparators which compare the phase of the signal which has passed through these delay elements with the phase of either the aforementioned carrier output or the aforementioned first phase modulating element output, which have not passed through these delay elements; and a logic gate to which are input the outputs of these first phase comparators, and which outputs an n-bit digital signal.

With this alternative configuration, it is desirable for all the aforementioned delay elements to be provided on the output path side of the aforementioned carrier, and for a fixed delay element with delay time:

$$T \cdot [(\tfrac{1}{4}) - 2^{(n+1)}]$$

to be inserted in the output path of the aforementioned first phase modulating element.

It is desirable for the aforementioned delay elements to be inserted in approximately equal numbers on the output path side of the aforementioned carrier and on the output path side of the aforementioned first phase modulating element. The carrier should be a sine wave.

The aforementioned delay elements can also be constituted from delay elements with unit delay times of $T/2^{n+1}$ cascade-connected in a plurality of stages.

According to an alternative configuration, this invention has the analog-to-digital converter explained in the earlier part of this section and the analog-to-digital converter explained in the latter part of this section; and in respect of a common analog signal input, the output of the analog-to-digital converter explained in the earlier part constitutes the more significant bits, and the output of the analog-to-digital converter explained in the latter part constitutes the less significant bits.

In these ways, high-resolution analog-to-digital conversion can be achieved by means of simple circuit configurations, and high-speed analog-to-digital conversion can be performed.

BRIEF EXPLANATION OF THE DRAWINGS

FIG. 1 is a block diagram of a first embodiment of this invention.

FIG. 2 shows the relation between analog signal strength and digital signal output.

FIG. 9 is a block diagram of a phase modulating element.

FIG. 10 is a block diagram of phase comparators.

FIG. 12 shows the relation between output and the phase difference detected by a phase comparator.

FIG. 13 shows input and output waveforms of the logic gate.

OPTIMUM CONFIGURATIONS FOR EMBODYING THE INVENTION

First embodiment

Figure 3:
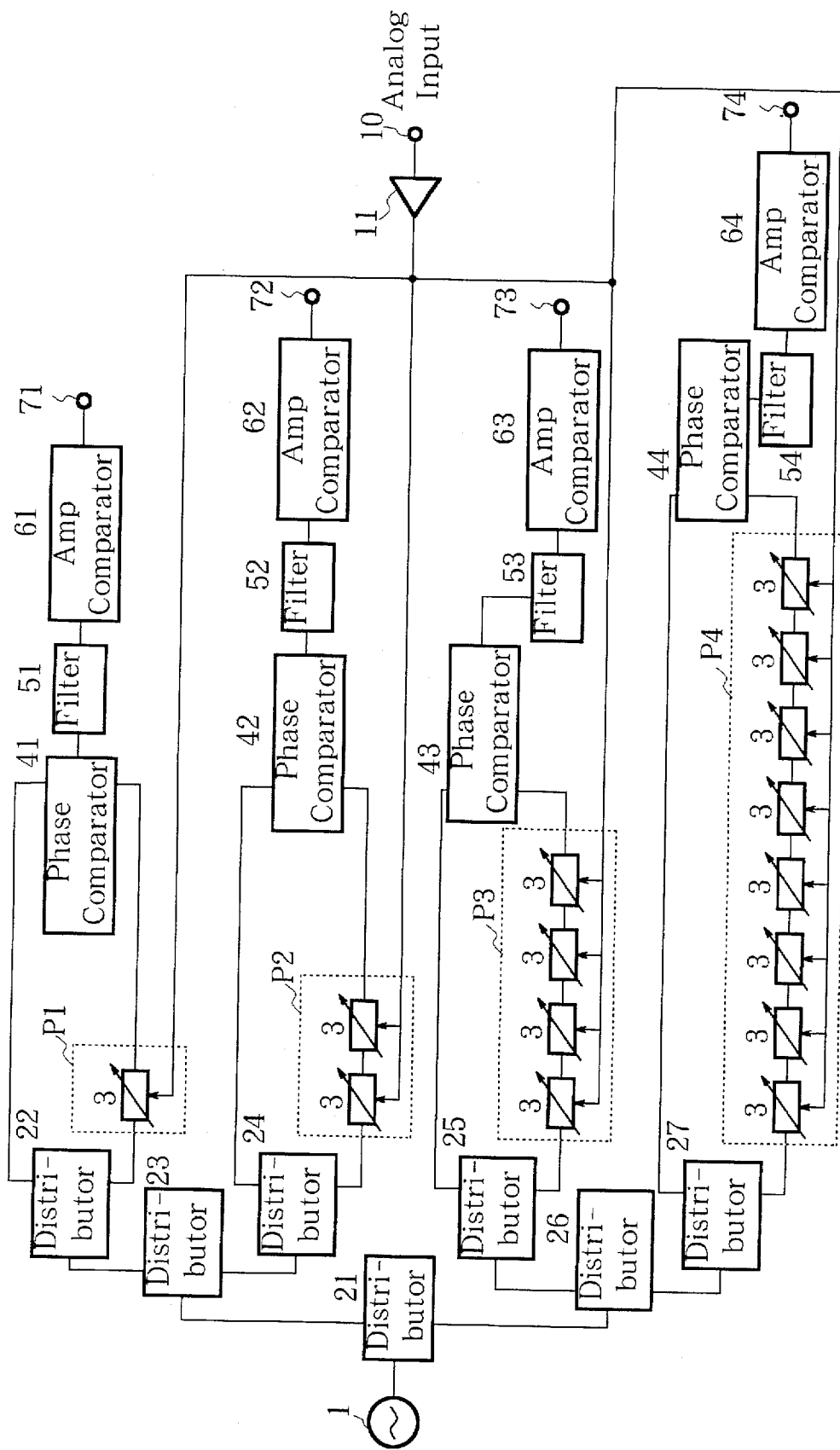
FIG. 3 is a block diagram of a second embodiment of this invention.

The configuration of a first embodiment of this invention will be explained with reference to FIG. 1, which is a block diagram of said first embodiment.

This invention is an analog-to-digital converter, and its distinguishing features are that it has analog signal input terminal 10, sine wave source 1 as the carrier generator, and a plural number n of phase modulators P1~Pn which respectively phase modulate this sine wave signal with the analog signal; and the modulation factor of the $i^{th}$ phase modulator Pi of these n phase modulators P1~Pn is:

$$2^{(i-1)} \times \pi \text{ radians}$$

and it has n phase comparators 41~4n which respectively compare the phase of the output of these n phase modulators P1~Pn with the phase of the sine wave signal, and n digital signal output terminals 71~7n from which the output of these phase comparators 41~4n is sent. The number of phase modulators P1~Pn and phase comparators 41~4n provided is equal to the number of bits n of the digital signal that is output; and if the aforementioned modulation factor of phase modulator P1 corresponding to the position of the most significant bit (MSB) is made π radians, the modulation factor of phase modulator Pn corresponding to the position of the $n^{th}$ bit from the MSB will be $2^{n-1}\pi$ radians.

The output from sine wave source 1 is supplied to phase modulators P1~Pn, the number of which is the same as the resolution (n bits). The phase of these inputs is modulated in proportion to the analog signal that is input from analog signal input terminal 10. Relative to the full scale of the input, the modulation factor of phase modulating elements 31~3n in phase modulators P1~Pn doubles from one phase modulator to the next, being 0~π radians in the case of phase modulating element 31 and 0~2π radians in the case of phase modulating element 32. The outputs of phase modulators P1~Pn are compared with the phase of the original sine wave by means of phase comparators 41~4n. As shown in FIG. 12, the output of phase comparators 41~4n is made "L" when the phase difference is 0±(½)π radians, and "H" when the phase difference is π±(½)π radians.

In the case of the MSB, because the modulation factor of phase modulator P1 is π radians, the output of phase comparator 41 will be "L" for analogue inputs of up to ½ full scale, and "H" when this is exceeded.

Because the next bit after the MSB will have a modulation factor of twice this, i.e., 2π radians, the output of phase comparator 42 will change from "L" to "H" at ¼ full scale analog input and will then return to "L" at ¾ full scale.

Subsequently, the periodicity of the output of phase comparators 41~4n doubles with every move to a less significant bit. This is illustrated in FIG. 2, which shows the relation between analog signal strength and digital signal output, with analogue signal strength plotted along the horizontal axis and digital signal output plotted along the vertical axis. Looking at this, it will be seen that the outputs of phase comparators 41~4n constitute a conversion of the analog signal to a digital signal in positive logic Gray code.

Second embodiment

Next, a second embodiment of this invention will be explained with reference to FIG. 3, which is a block diagram of said second embodiment. Hereinafter, in order to simplify the explanation, the resolution (number of bits n) will be assumed to be "4". The output of sine wave source 1 is divided into equiphase signals by distributors 21~27, the number of said signals being the same as the resolution (4 bits). Each of the branches divided in this way corresponds to a data bit.

The signals thus split into branches are each further divided into two equiphase signals. One of these is input to phase comparators 41~44 via phase modulators P1~P4. The other divided signal is input to the same phase comparators 41~44 as the reference signal. The outputs of phase comparators 41~44 are input to amplitude comparators 61~64 via filters 51~54. These outputs are the digital signal outputs.

The modulation factor control terminals of phase modulators P1~P4 are connected to analog signal input terminal 10 via buffer amp 11. The modulation factor of phase modulators P1~P4 connected between distributors 21~27 in each branch and phase comparators 41~44 is 0~π radians in the branch corresponding to the MSB and thereafter doubles with every move to a less significant bit. In this second embodiment of the invention, this is achieved by connecting a plurality of phase modulating elements 3 in series, each phase modulating element having a modulation factor of 0~π radians. That is to say, there is one in the MSB branch and two in the branch corresponding to the next bit. The number of phase modulating elements 3 doubles with every move to a less significant bit, becoming $2^{n-1}$ at the least significant bit (LSB). Since n=4, there will be 8 phase modulating elements 3 at the LSB.

Next, the operation of this second embodiment of the invention will be explained. The sine wave that is output from sine wave source 1 is split into two equiphase signals. The frequency of this sine wave signal is sufficiently higher than the bandwidth of the analog signal input, and the purer it is, the better. The phase of one of the split signals is changed in proportion to the amplitude of the analog signal input, and the resulting phase is compared, by phase comparators 41~44, with the phase of the other divided signal. In this second embodiment of the invention, multipliers are used as phase comparators 41~44. The product of two sine functions with different phases is as follows:

$$\sin(\omega t+\theta) \times \sin \omega t = \frac{1}{2}[\cos\theta - \cos(2\omega t+\theta)] \quad (1)$$

where ω is angular frequency, t is time and θ is phase difference. It will be seen from this that output which is proportional to the cosine of the phase difference is obtained by applying filters 51~54 to the output of the multipliers and thereby removing the component which is twice the frequency of the original sine wave.

Figure 4:
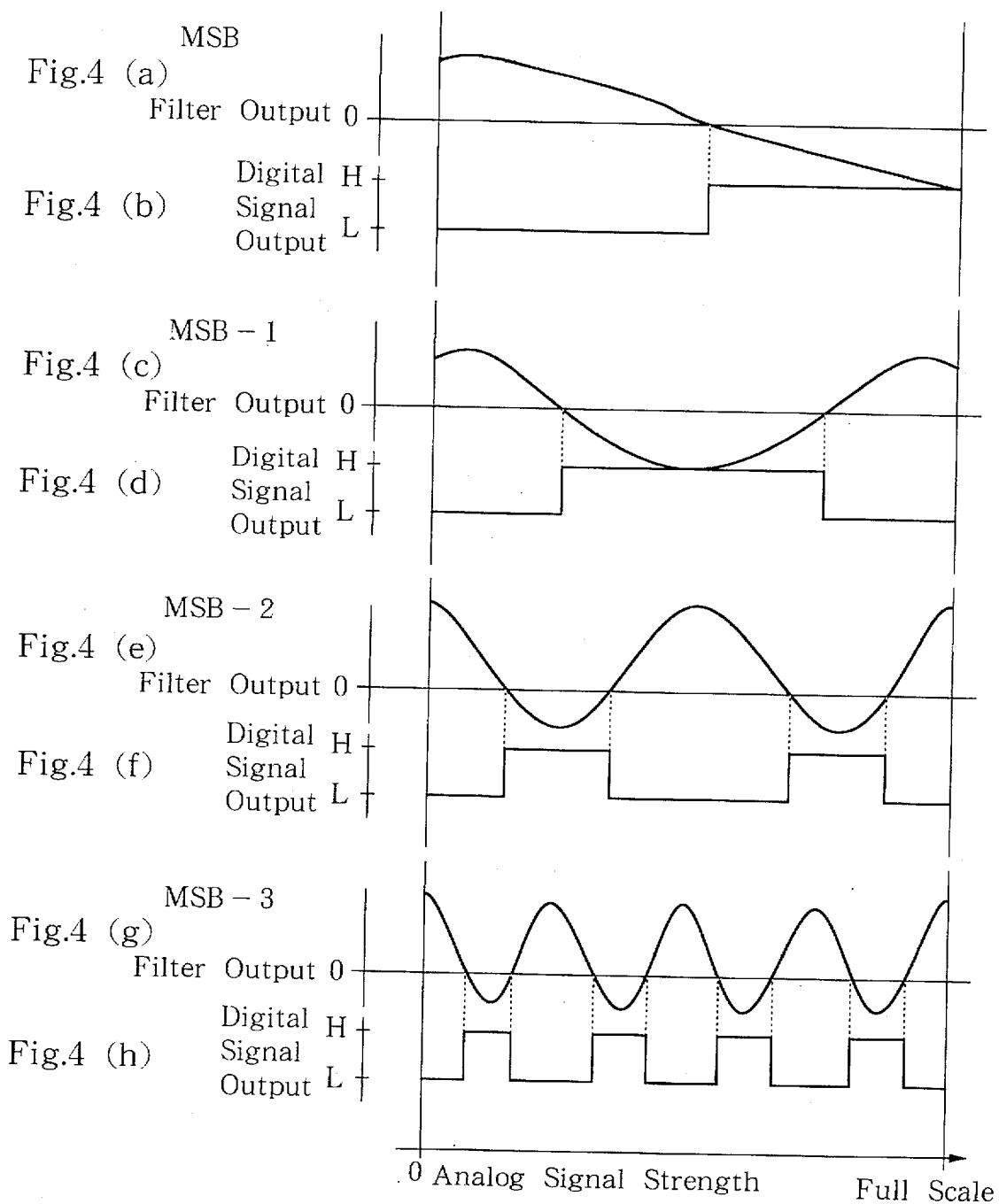
FIG. 4 shows the relations among analog signal strength, filter output, and digital signal output.

When the analog signal input changes from zero to full scale, the phase of phase modulator P1, which corresponds to the MSB, changes from 0 to π radians, and therefore the output of phase comparator 41 will be proportional to a half-period of the cosine function. By passing this through amplitude comparator 61 which has zero as the reference level, and inverting the logical level, digital data which show a low level for inputs of up to ½ full scale and a high level for inputs greater than this will be obtained. In the same general way, digital data corresponding to successively less significant bits is obtained in accordance with the operating principles already described. FIG. 4 shows the relations among analog signal strength, output of filters 51~54, and digital signal output, with analog signal strength plotted along the horizontal axis and filter output and digital signal output plotted along the vertical axis. The phase of the output of filters 51~54 is proportional to the analog signal that is input from analog signal input terminal 10, and the modulation factor involved successively doubles as shown from FIG. 4(a) to FIG. 4(d), relative to full-scale input. The outputs of these filters 51~54 are inputs to amplitude comparators 61~64 and are thereby outputs as digital signals.

Third embodiment

Figure 5:
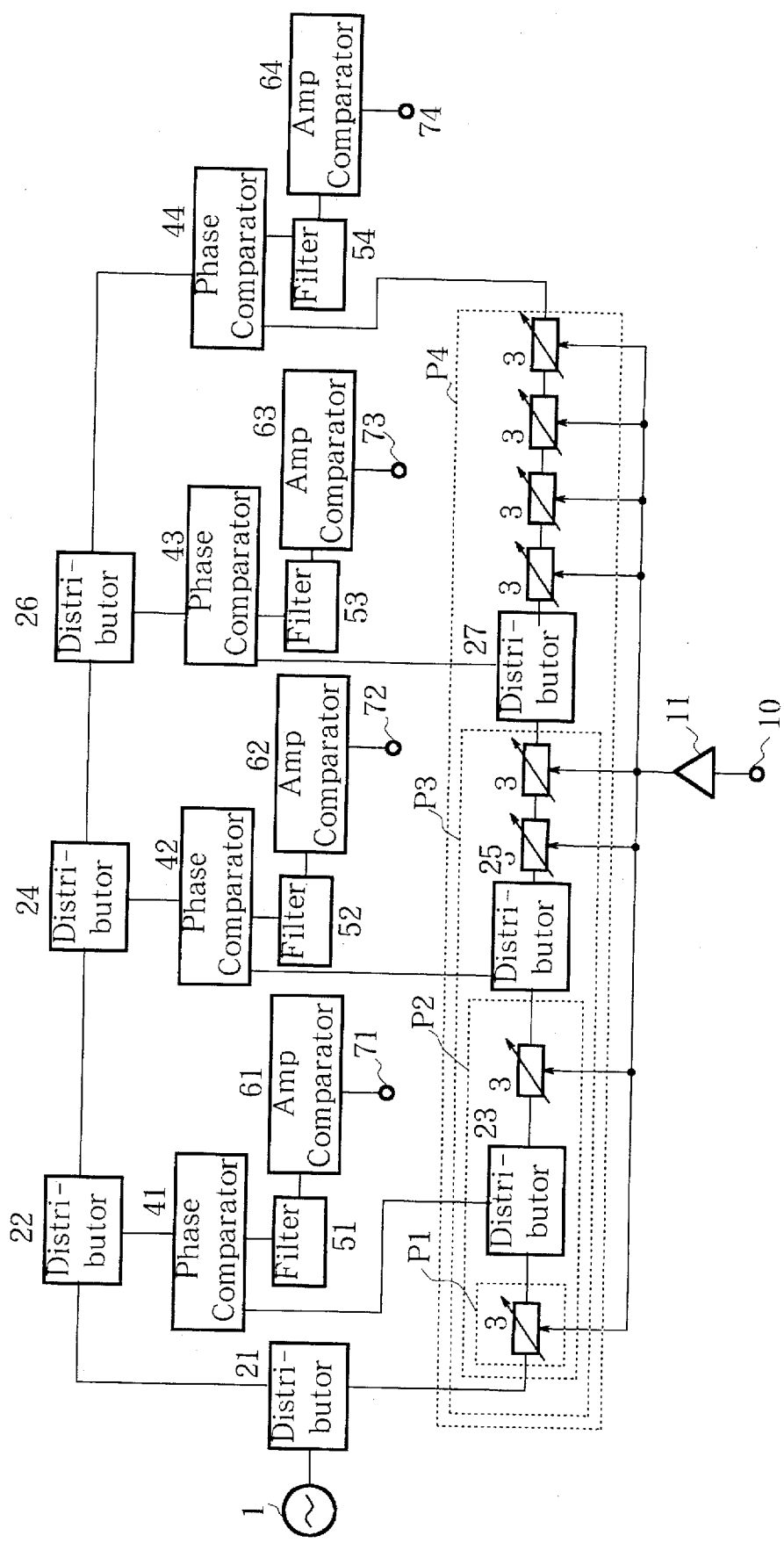
FIG. 5 is a block diagram of a third embodiment of this invention.

Next, a third embodiment of this invention will be explained with reference to FIG. 5, which is a block diagram of said third embodiment. The output of sine wave source 1 is split into two equiphase signals by distributor 21. One of these will be called the reference signal and the other will be called the signal to be modulated. The phase of the signal to be modulated is changed in proportion to the analog signal input by means of phase modulators P1~P4, and in the case of the LSB, it is compared with the reference signal by phase comparator 44. The output of this is connected to digital signal output terminal 74 by way of filter 54 and amplitude comparator 64, as in the second embodiment of this invention.

In the case of the MSB, part of the signal is extracted by distributor 23 and input to phase comparator 41. Likewise, part of the reference signal is extracted by distributor 22 and input to phase comparator 41. The output of this is connected to digital signal output terminal 71 by way of filter 51 and amplitude comparator 61, as in the second embodiment of this invention.

The other bits are dealt with in a similar way. Namely, a signal corresponding to each bit is extracted by branching off from a position at which the modulation factor of the modulated signal has been weighted in binary, and comparing the phase of this with the phase of a signal branched off from the reference signal. In other words, the number of phase modulating elements 3 from sine wave source 1 to the output of a given bit (this number will be related to the total modulation factor) is 1 at the branch which outputs the MSB, doubles to 2 at the next bit, and becomes $2^{n-1}$, i.e. 8, at the LSB.

Fourth embodiment

Figure 6:
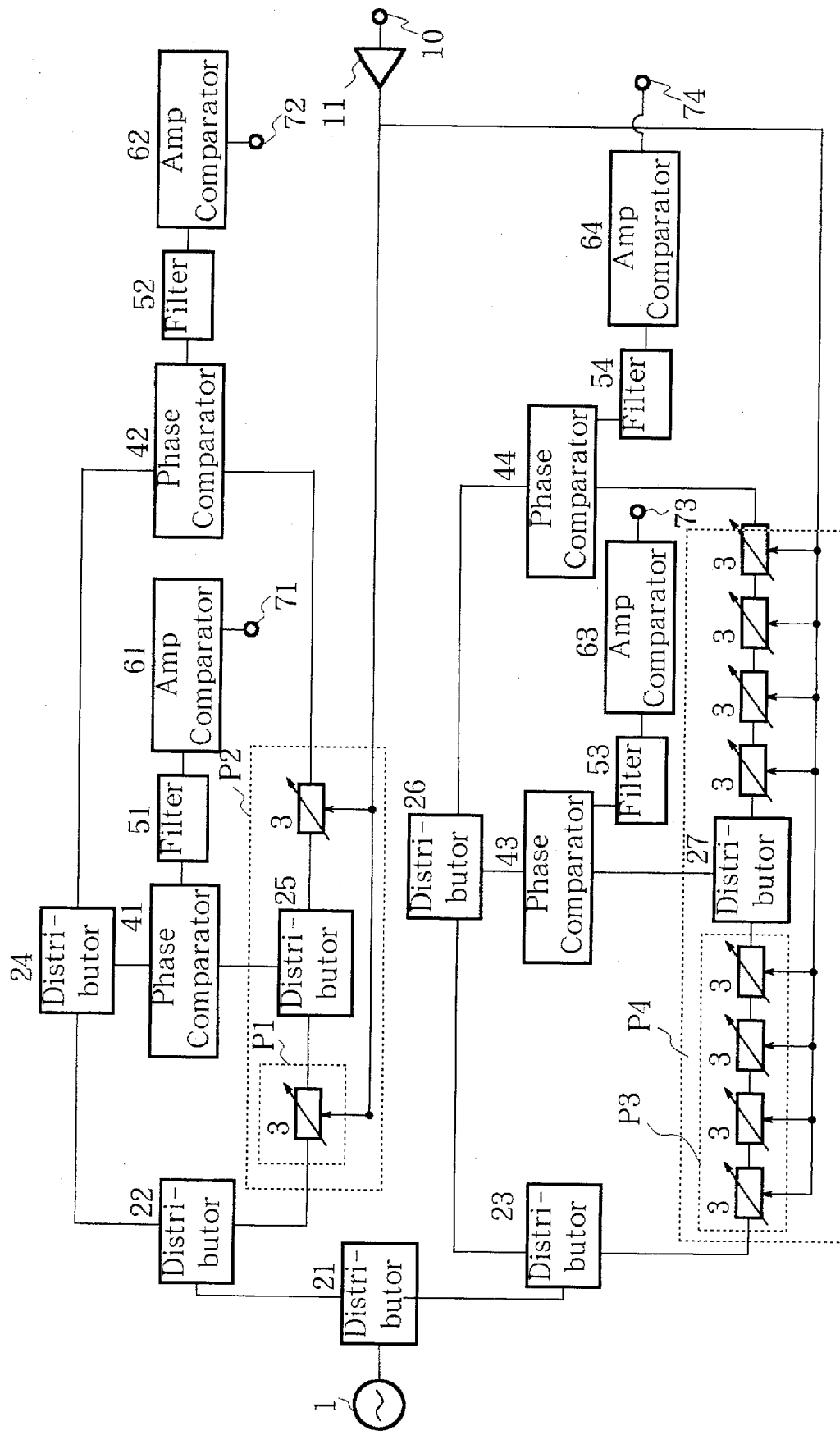
FIG. 6 is a block diagram of a fourth embodiment of this invention.

Next, a fourth embodiment of this invention will be explained with reference to FIG. 6, which is the block diagram of said fourth embodiment. As shown in FIG. 6, the four bits are split into two groups: namely, a group consisting of the more significant two bits and a group consisting of the less significant two bits. Within each group, the configuration taught in the third embodiment of this invention is employed, while between the groups the configuration taught in the second embodiment is employed. The third embodiment makes do with fewer phase modulating elements 3 than the second embodiment, but because the signal level drops as the level of significance decreases, the resolution cannot be improved. The advantage of this fourth embodiment of the invention is that a balance is struck between the number of phase modulating elements 3 and the resolution.

Fifth embodiment

Figure 7:
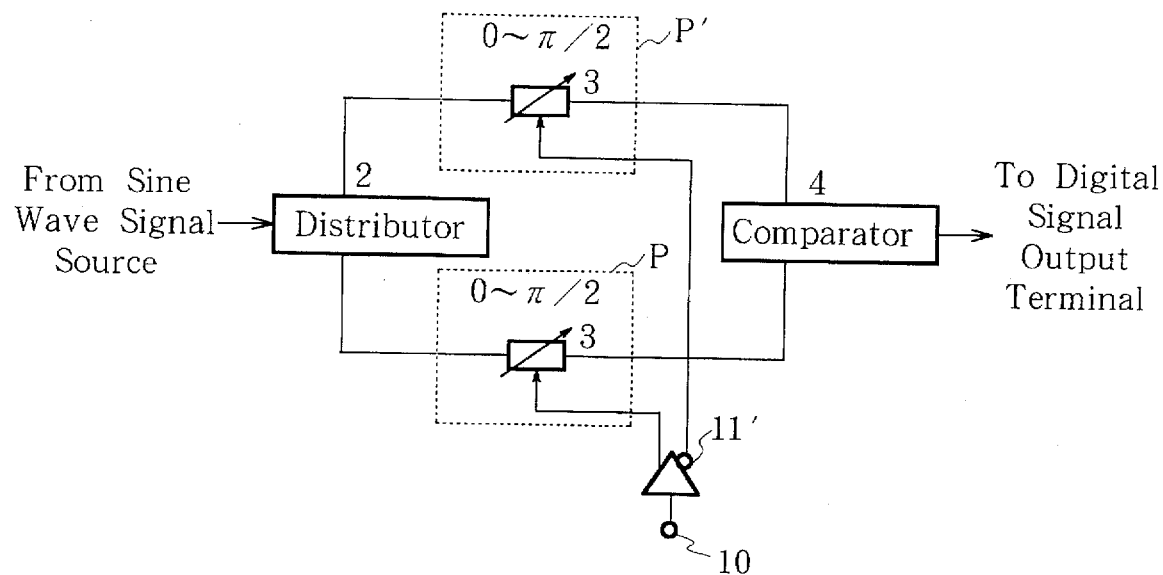
FIG. 7 is a block diagram of a fifth embodiment of this invention.

Next, a fifth embodiment of this invention will be explained with reference to FIG. 7, which is a block diagram of said fifth embodiment. Whereas in the second, third and fourth embodiments of this invention phase modulators P were put only in the side of the signal to be modulated, in this fifth embodiment they are also put in the reference signal side, and these phase modulators on the two different sides are differentially driven. Phase modulators P and P' both have a modulation factor of 0~(½)π radians, and their modulation factor is controlled by the analog signal which has been changed to complementary signals by buffer amp 11' with differential output. This configuration can be applied in the second, third and fourth embodiments of this invention. This principle can also be applied in the first embodiment of this invention.

Figure 8:
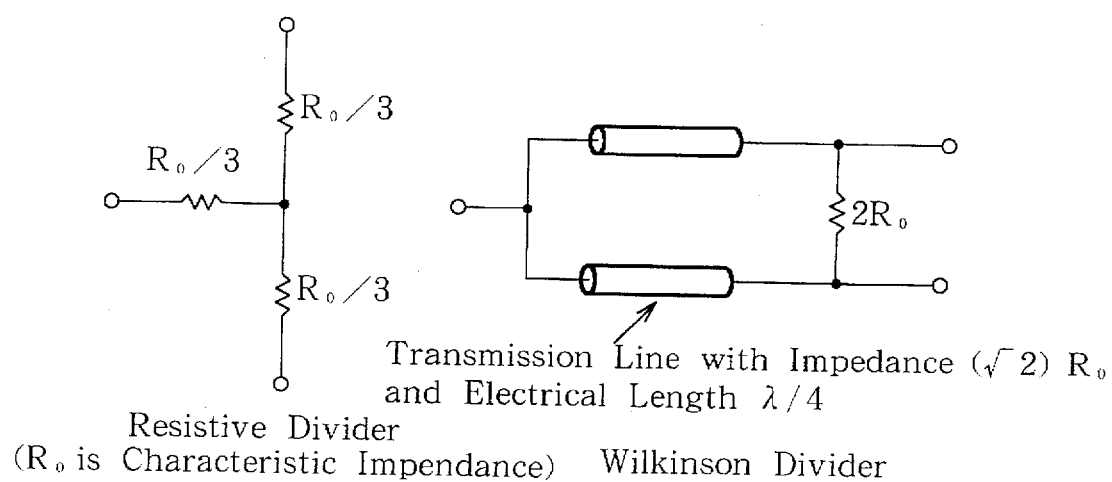
FIG. 8 is a block diagram of distributors.

Next, configurations of distributors 2 and 21~27, phase modulating elements 3 and 31~3n, and phase comparators 4 and 41~4n in the first to the fifth embodiments of this invention will be explained with reference to FIGS. 8~10. FIG. 8 is a block diagram of distributors 2 and 21~27. FIG. 9 is a block diagram of phase modulating elements 3 and 31~3n, and FIG. 10 is a block diagram of phase comparators 4 and 41~4n. As shown in FIG. 8(a), resistive splitters may be used for distributors 2 and 21~27. Alternatively, as shown in FIG. 8(b), Wilkinson dividers may be employed.

As shown in FIG. 9, elements which combine a π/2 radian hybrid and varactor diodes are employed as phase modulating elements 3 and 31~3n. By causing the reverse bias voltage of the varactor diodes to vary in accordance with the analogue input, the phase of the reflected wave changes and, as a result, the phase of the output of the hybrid changes. Various other devices may be used as the π/2 radian hybrid, including so-called "branch-line" and "rat-race" hybrids, and directional couplers.

As shown in FIG. 10(a), multipliers may be employed as phase comparators 4 and 41~4n. Alternatively, as shown in FIG. 10(b), double-balanced mixers based on diodes may be employed.

Although distributors 21~27 used in the second embodiment of this invention are 1:2 distributors, this embodiment can also be implemented using 1:n distributors.

Sixth embodiment

Figure 11:
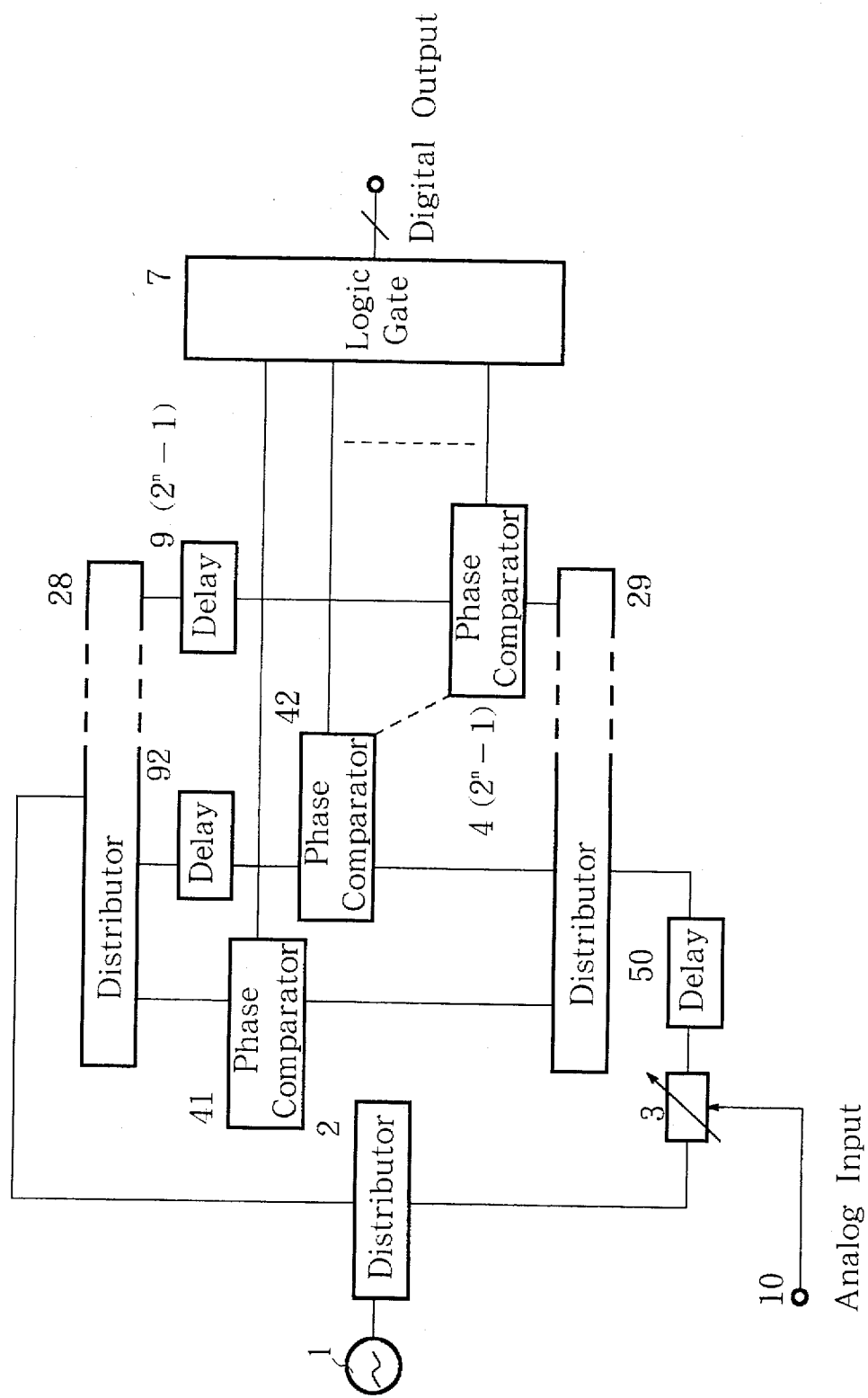
FIG. 11 is a block diagram of a sixth embodiment of this invention.

The configuration of a sixth embodiment of this invention will be explained with reference to FIG. 11, which is a block diagram of said sixth embodiment.

This invention is an analog-to-digital converter, and its distinguishing features are that: it has analog signal input terminal 10, sine wave source 1 serving as a carrier generator, and phase modulating element 3 which phase modulates this sine wave with the analog signal, and $2^n-1$ delay elements 92~9($2^n-1$) are provided on distributor 28 serving as the output path of the aforementioned sine wave, or on distributor 29 serving as the output path of phase modulating element 3; said delay elements applying, in $2^n-1$ stages (where n is the resolution), different relative delays between the aforementioned sine wave and the output signal of phase modulating element 3; and the relative delay time of the $i^{th}$ delay element 9$i$ ($i \leq n$) of these $2^n-1$ delay elements 92~9($2^n\pm1$) is set to:

$$(i-1) \cdot T/(2^{n+1})$$

where T is the carrier period; and there are also provided $2^n-1$ phase comparators 41~4($2^n-1$) which compare the phase of the signal which has passed through these delay elements 92~9($2^n-1$) with the phase of either the aforementioned sine wave output or of the output of phase modulating element 3, said output not having passed through these delay elements 92~9($2^n-1$); and logic gate 7 to which are input the outputs of these phase comparators 41~4($2^n-1$), and which outputs an n-bit digital signal.

In this sixth embodiment of the invention, all the delay elements 92~9($2^n-1$) are provided on distributor 28 side, and fixed delay element 50 with a delay time of:

$$T \cdot [(¼) - 2^{-(n+1)}]$$

is inserted in the output path of phase modulating element 3.

The output of sine wave source 1 is split into two by distributor 2. One of the outputs of distributor 2 is split into $2^n-1$ branches (where n is the resolution in bits) by distributor 28. One of these branches is connected to phase comparator 41, while the remainder are connected to phase comparators 42~4($2^n-1$) via delay elements 92~9($2^n-1$). The delay times of delay elements 92~9($2^n-1$) are as follows. The delay time of delay element 92 is $T/2^{n+1}$ (where T is the period of the carrier), and the delay time of subsequent delay elements increases successively in steps of $T/2^{n+1}$, with the $i^{th}$ delay becoming $(i-1) \cdot T/2^{n+1}$. The other output of distributor 2 is split into $2^n-1$ branches by distributor 29 via phase modulating element 3 and delay element 50, and these branches are input to the other terminals of phase comparators 41~4($2^n-1$). The delay time of delay element 50 is $T \cdot (¼ - 2^{-(n+1)})$, which is equal to that of the middle of the aforementioned $2^n-1$ delay elements 92~9($2^n-1$). The analog signal input is applied to analog signal input terminal 10 of phase modulating element 3. The output of phase comparators 41~4($2^n-1$) is output via logic gate 7.

Next, the operation of this sixth embodiment of the invention will be explained with reference to FIG. 12 and FIG. 13. FIG. 12 shows the relation between the phase difference detected by phase comparators 41~4($2^n-1$) and their output, with phase difference plotted along the horizontal axis and output state plotted along the vertical axis. FIG. 13 shows the input and output waveforms of logic gate 7, with analog input level plotted along the horizontal axis and the input and output waveforms plotted along the vertical axis. First of all, the output sine wave of sine wave source 1 is split into two equiphase signals by distributor 2. The phase of one of these is changed by phase modulating element 3 in proportion to the amplitude of the analog signal input. This is then compared by phase comparators 41~4 ($2^n-1$) with the phase of the other signal split by distributor 2.

It will be assumed that the phase of phase modulating element 3 changes from 0 to π radians when the analog signal input changes from "0" to full scale. It will also be assumed that, as shown in FIG. 12, the output of phase comparators 41~4($2^n-1$) is "H" when the phase difference of the input is π±π/2 radians, and "L" when said phase difference is 0±π/2 radians. Under these circumstances, the outputs from phase comparators 41~4($2^n-1$) will be as shown in FIG. 13(a). Note that FIG. 13 shows an example of 3-bit resolution. If logical operations are carried out on these outputs by logic gate 7, the output of said logic gate will be as in FIG. 13(b), with the result that the analog input is converted to a digital signal in positive logic Gray code.

Figure 14:
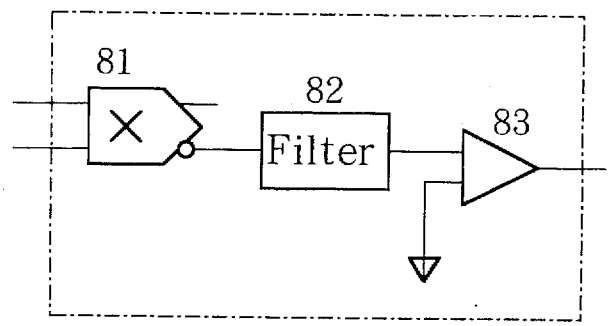
FIG. 14 shows a specific configuration of a phase comparator.

A specific configuration for phase comparators 41~4($2^n-1$) will be explained with reference to FIG. 14, which shows said configuration. The two signals whose phase is to be compared are first of all multiplied by multiplier 81. The product of two sine functions of different phase can be expressed by Eq.1 noted above. It will be seen from this equation that output which is proportional to the cosine of the phase difference can be obtained by passing the output of multiplier 81 through filter 82 and thereby removing the component which is twice the frequency of the original sine wave. If the sign of this result is then inverted (in FIG. 14, the inverted output is extracted) and a digital signal restored by using amplitude comparator 83 for zero-level amplitude discrimination, the phase comparison characteristic shown in FIG. 12 is obtained.

Figure 15:
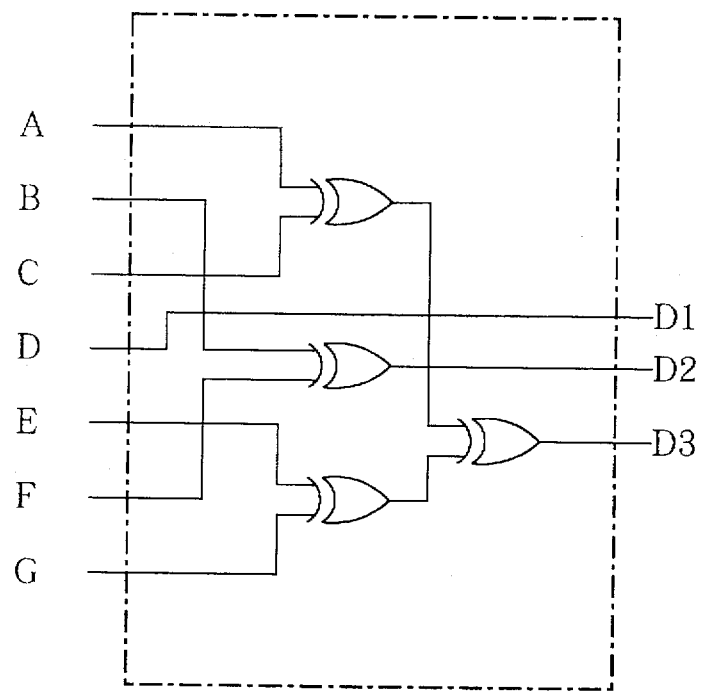
FIG. 15 shows a specific configuration of the logic gate.

A specific configuration for logic gate 7 is shown in FIG. 15. In this sixth embodiment of the invention, this logic gate comprises a combination of a plurality of exclusive OR gates.

Seventh embodiment

Figure 16:
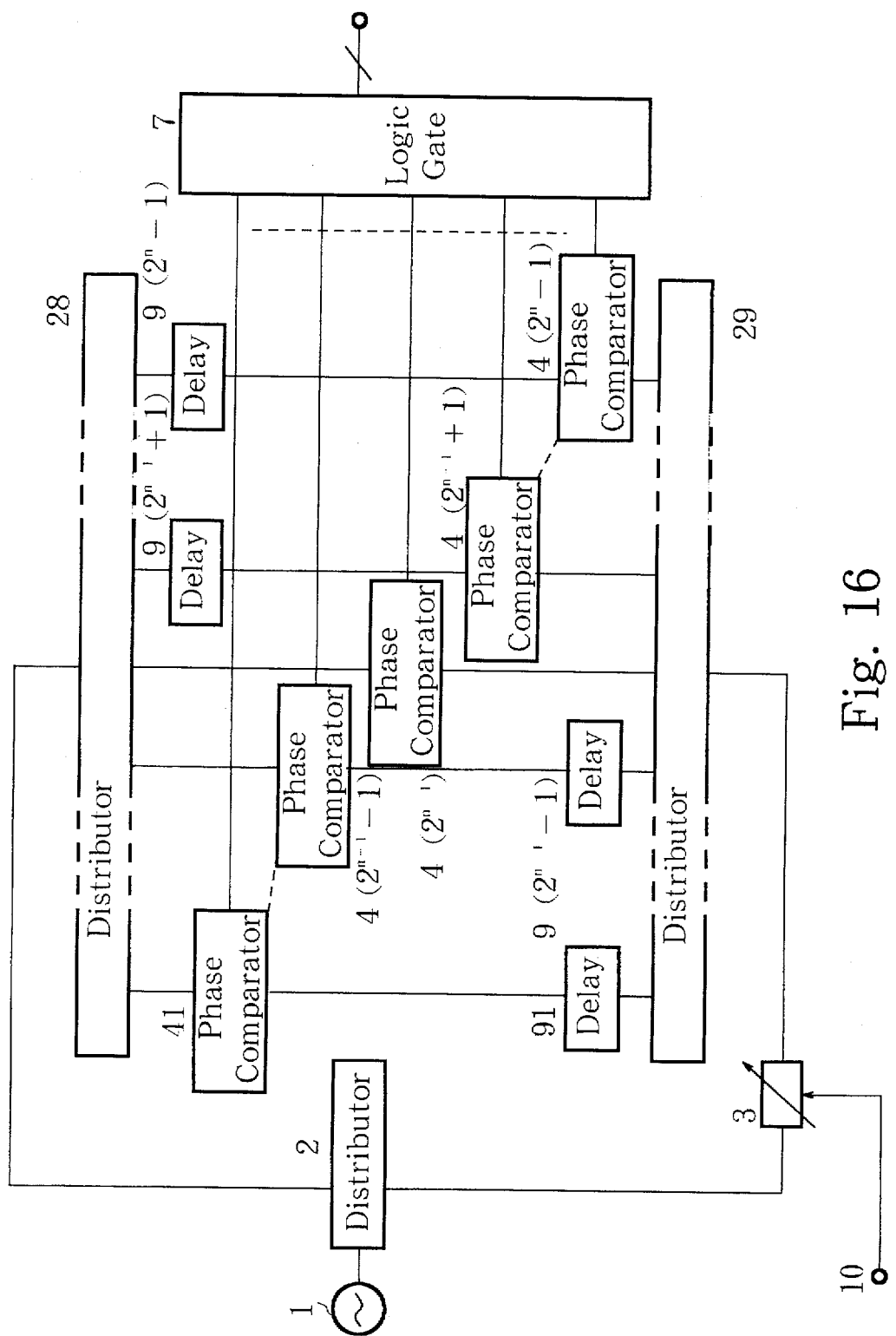
FIG. 16 is a block diagram of a seventh embodiment of this invention.

A seventh embodiment of this invention will be explained with reference to FIG. 16, which is a block diagram of said seventh embodiment. As shown in FIG. 16, one of the inputs of phase comparators $41 \sim 4(2^{n-1}-1)$ is connected to distributor 28, and the other of the inputs of the same phase comparators $41 \sim 4(2^{n-1}-1)$ is connected to distributor 29 via delay elements $91 \sim 9(2^{n-1}-1)$. Phase comparator $4(2^{n-1})$ is connected directly to distributors 28 and 29. One of the inputs of phase comparators $4(2^{n-1}+1) \sim 4(2^n-1)$ is connected to distributor 28 via delay elements $9(2^{n-1}+1) \sim 9(2^n-1)$, and the other of the inputs of the same phase comparators $4(2^{n-1}+1) \sim 4(2^n-1)$ is connected directly to distributor 29. An analog-to-digital converter which is similar to the sixth embodiment can be implemented by means of the configuration illustrated in FIG. 16.

Eighth embodiment

Figure 17:
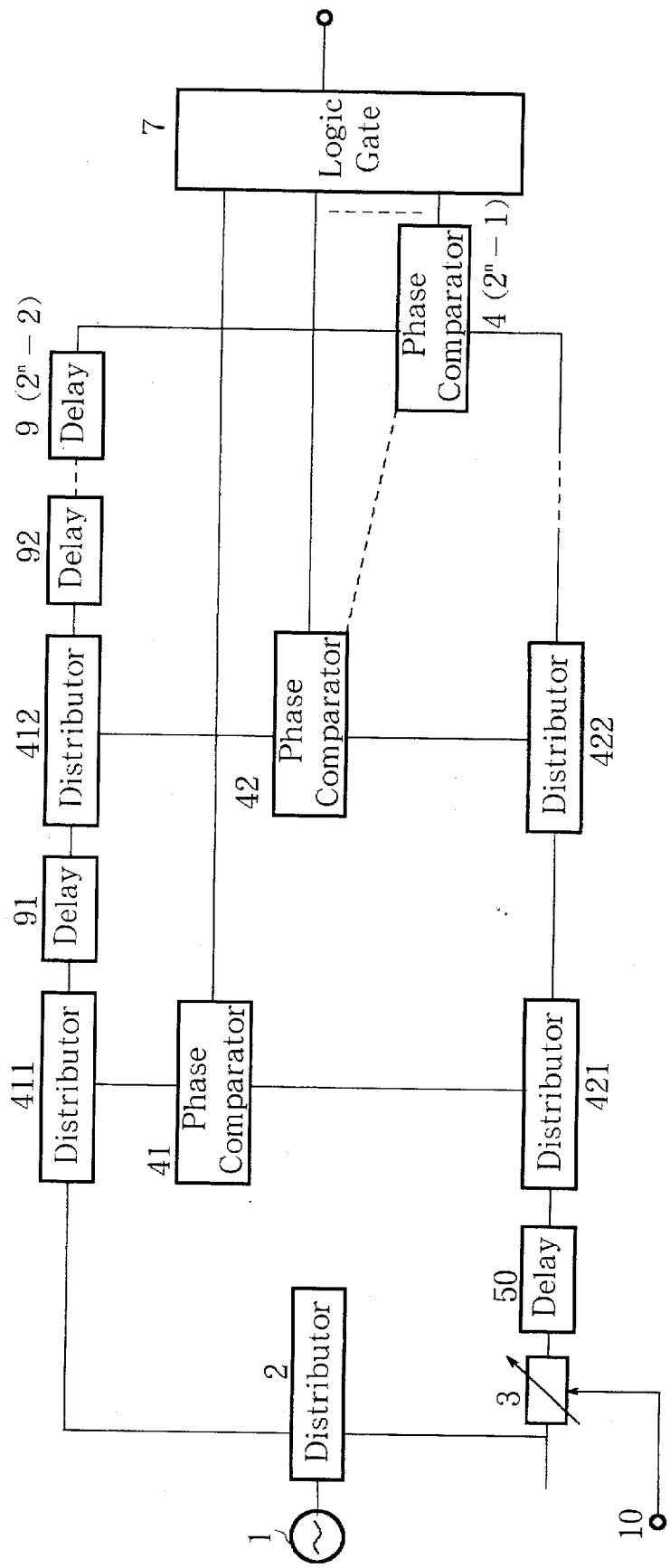
FIG. 17 is a block diagram of an eighth embodiment of this invention.

An eighth embodiment of this invention will be explained with reference to FIG. 17, which is a block diagram of said eighth embodiment. As shown in FIG. 17, $2^n-2$ delay elements $91 \sim 9(2^n-2)$ with delay times of $T/2^{n+1}$ are connected in series, and phase differences between, on the one hand, distributors 411, 412, . . . interposed between said delay elements, and on the other hand, distributors 421, 422, . . . connected to the output of phase modulating element 3 and delay element 50, are detected. An analog-to-digital converter which is similar to the sixth embodiment or the seventh embodiment can be implemented by means of the configuration illustrated in FIG. 17.

Ninth embodiment

Figure 18:
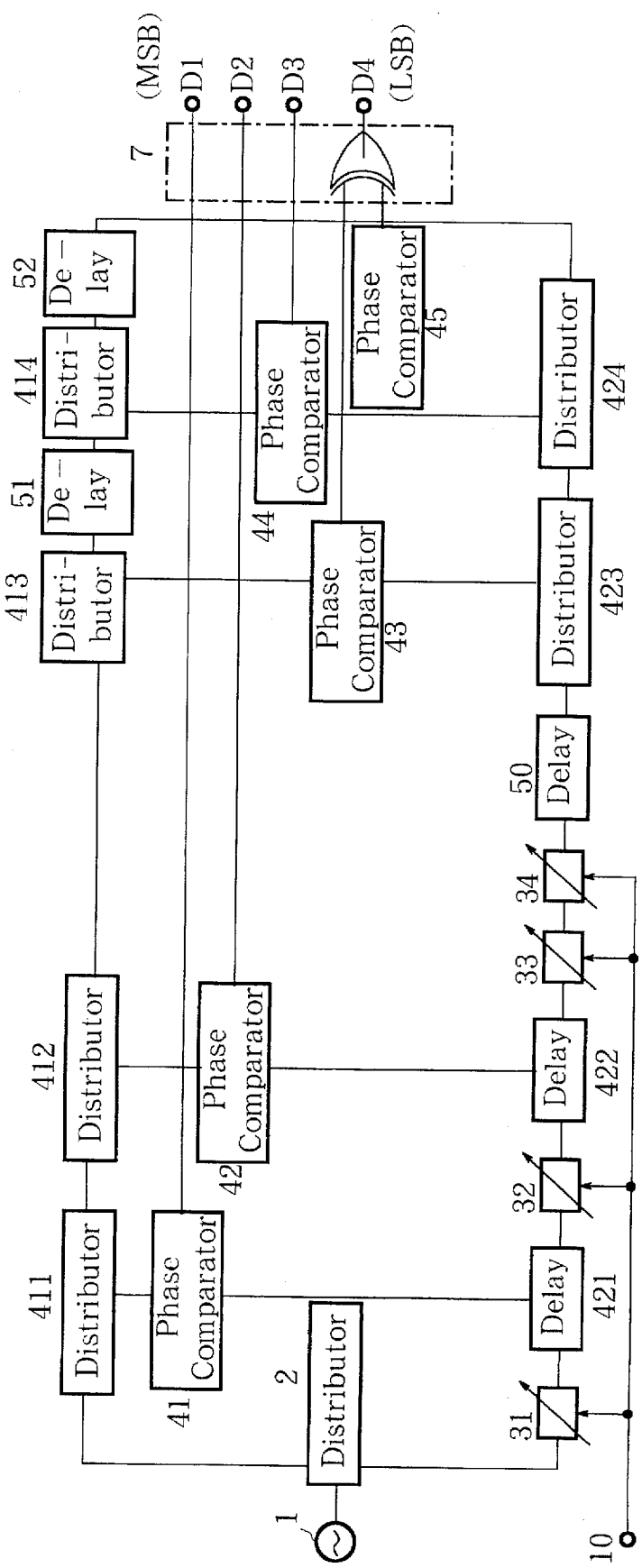
FIG. 18 is a block diagram of a ninth embodiment of this invention.
Figure 19:
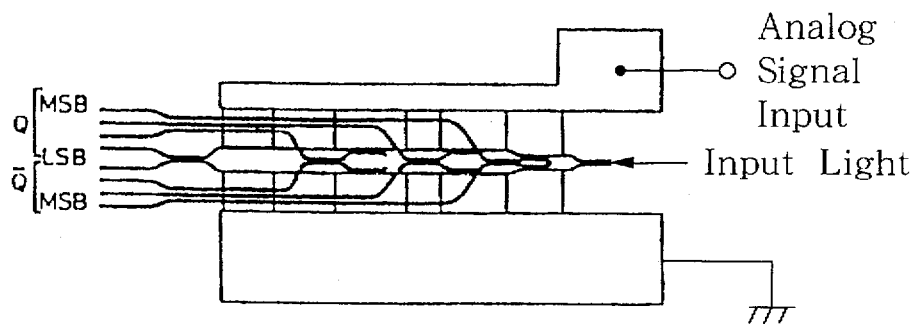
FIG. 19 shows a conventional ultrahigh-speed analog-to-digital converter.
Figure 19:
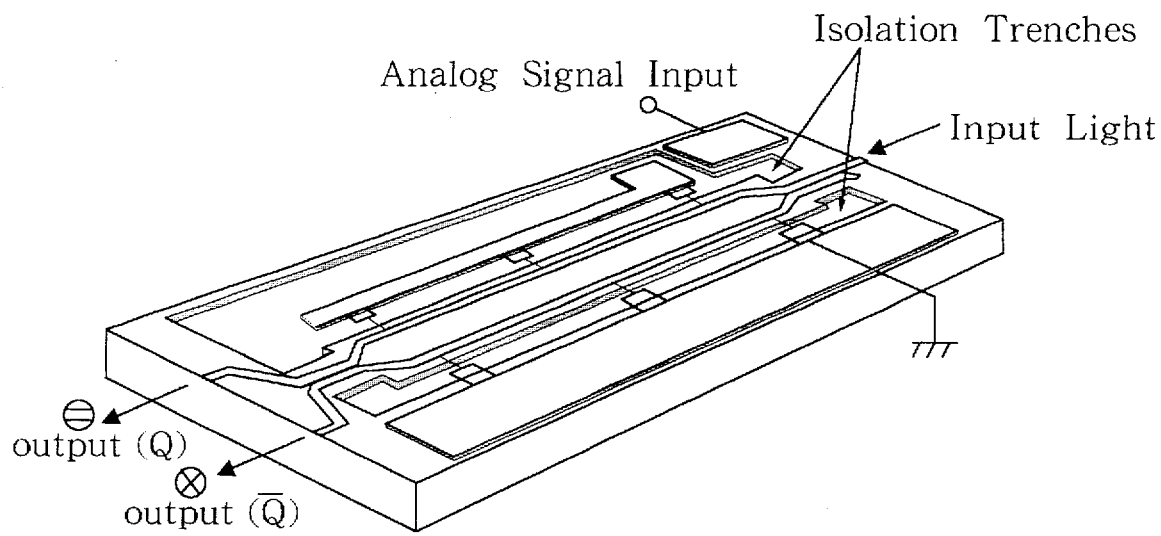
Figure 19:
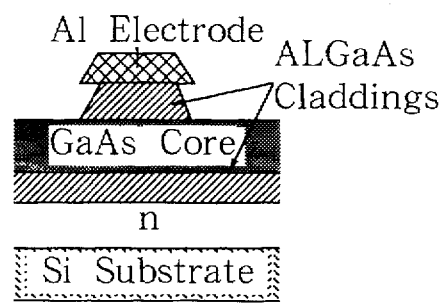

A ninth embodiment of this invention will be explained with reference to FIG. 18, which is a block diagram of said ninth embodiment. As shown in FIG. 18, an analog-to-digital converter is implemented in this ninth embodiment of the invention by applying the method taught in the first to the fifth embodiments to the more significant bits, and by applying the method taught in the sixth to the eighth embodiments to the less significant bits. According to the specific method illustrated here, the two more significant bits of the 4-bit output are formed by means of the third embodiment, while the two less significant bits are formed by means of the eighth embodiment.

By striking a balance between the number of phase modulating elements 31~34 and the number of phase comparators 41~45, the analog-to-digital converter can be implemented by means of less hardware. For example, on the assumption that a 6-bit analog-to-digital converter is to be built, the sixth embodiment of this invention would require one phase modulating element 3 and sixty-three phase comparators $41 \sim 4(2^n-1)$. On the other hand, if the three more significant bits are obtained by means of the third embodiment and the three less significant bits are obtained by means of the eighth embodiment, then although the number of phase modulating elements 3 increases to eight, only ten phase comparators $41 \sim 4(2^n-1)$ are required.

In the sixth to the ninth embodiments of this invention, the specific configuration of distributors 2, 28, 29 and 411~424 can be implemented by means of the same configurations as those already depicted in FIG. 8. The specific configuration of phase modulating elements 3 and 31~34 can be implemented by means of the same configuration as that already shown in FIG. 9. The specific configuration of phase comparators $41 \sim 4(2^n-1)$ can be implemented by means of the same configurations as those already shown in FIG. 10. Delay elements $91 \sim 9(2^n-1)$ and 50 can be implemented by a variety of means, including transmission line (coaxial cable, microstrip line or coplanar line) the length of which is adjusted to give the desired delay time.

I claim:

1. Analog-to-digital converter comprising:
   an analog signal input terminal for receiving an analog signal input thereto;
   a carrier generator for providing a carrier;
   n phase modulators which respectively receive the analog signal and the carrier and respectively phase modulate the carrier with the analog signal, a modulation factor of the $i^{th}$ modulator of the n phase modulators ($i \leq n$) is: $\theta \times 2^{i-1}$ where $\theta$ is a constant; and
   n phase comparators which respectively compare the phase of the output of the n phase modulators, respectively with the phase of the carrier and n digital output terminals from which the output of the phase comparators is respectively sent; and
   wherein the carrier is a sine wave and $\theta=\pi$ radians.

2. Analog-to-digital converter as set forth in claim 1, wherein the $i^{th}$ phase modulator comprises phase modulating elements with their modulation factor cascade-connected in $2^{i-1}$ stages.

3. Analog-to-digital converter as set forth in claim 1, wherein at least some of a plurality of cascade-connected phase modulating elements are shared by the plurality of phase modulators.

4. Analog-to-digital converter comprising:
   an analog signal input terminal for receiving an analog signal input thereto;
   a carrier generator for providing a carrier;
   a first phase modulating element which receives the analog signal and the carrier and phase modulates the carrier with the analog signal;
   $2^n-1$ delay elements provided in the output path of the carrier or in the output path of the first phase modulating element, said delay elements applying, in $2^n-1$ stages (wherein n is the resolution), different relative delays between the carrier and the output signal from the first phase modulating element, the relative time delay of the $i^{th}$ element of the $2^n-1$ delay elements ($i \leq n$) is set to $(i-1) \cdot T \backslash (2^{n+1})$ where T is the carrier period;
   $2^n-1$ first phase comparators which respectively compare the phase of the signal which has passed through the delay elements respectively with the phase of either the carrier output or the first phase modulating element output which have not passed through the delay elements; and
   a logic gate which receives the outputs of the first phase comparators and which outputs an n-bit digital signal; and
   wherein all the delay elements are provided on the output path side of the carrier, and a fixed delay element with delay time: T· is inserted in the output path of the first phase modulating element.

5. Analog-to-digital converter as set forth in claim 4, wherein the carrier is a sine wave.

6. Analog-to-digital converter as set forth in claim 4, wherein the delay elements comprise delay elements with unit delay time $T/2^{n+1}$ cascade-connected in a plurality of stages.

7. Analog-to-digital converter comprising:

an analog signal input terminal for receiving an analog signal input thereto;

a carrier generator for providing a carrier;

a first phase modulating element which receives the analog signal and the carrier and which phase modulates the carrier with the analog signal;

$2^n-1$ delay elements provided in the output path of the carrier or in the output path of the first phase modulating element, said delay elements applying, in $2^n-1$ stages (wherein n is the resolution), different relative delays between the carrier and the output signal from the first phase modulating element, the relative time delay of the $i^{th}$ element of the $2^n-1$ delay elements ($i \leq n$) is set to $(i\ 1) \cdot T \backslash (2^{n+1})$ where T is the carrier period;

$2^n-1$ first phase comparators which respectively compare the phase of the signal which has passed through the delay elements respectively with the phase of either the carrier output or the first phase modulating element output which have not passed through the delay elements; and a logic gate which receives the outputs of the first phase comparators and which outputs an n-bit digital signal; and wherein the delay elements are inserted in approximately equal numbers on the output path side of the carrier and on the output path side of the first phase modulating element.

8. Analog-to-digital converter as set forth in claim 7, wherein the carrier is a sine wave.

9. Analog-to-digital converter as set forth in claim 7, wherein the delay elements comprise delay elements with the unit delay time $T/2^{n+1}$ cascade-connected in a plurality of stages.

\* \* \* \* \*